United States Patent [19]

Dennison et al.

[11] Patent Number: 5,270,241
[45] Date of Patent: *Dec. 14, 1993

[54] OPTIMIZED CONTAINER STACKED CAPACITOR DRAM CELL UTILIZING SACRIFICIAL OXIDE DEPOSITION AND CHEMICAL MECHANICAL POLISHING

[75] Inventors: Charles H. Dennison; Michael A. Walker, both of Boise, Id.

[73] Assignee: Micron Technology, Inc., Boise, Id.

[*] Notice: The portion of the term of this patent subsequent to Nov. 10, 2009 has been disclaimed.

[21] Appl. No.: 973,092

[22] Filed: Nov. 6, 1992

Related U.S. Application Data

[63] Continuation of Ser. No. 850,746, Mar. 13, 1992, Pat. No. 5,162,248.

[51] Int. Cl.$^5$ .............................................. H01L 21/70
[52] U.S. Cl. ........................................ 437/52; 437/47; 437/48; 437/60; 437/225; 437/919
[58] Field of Search ....................... 437/47, 48, 52, 60, 437/225, 228, 235, 919, 986; 257/306

[56] References Cited

U.S. PATENT DOCUMENTS

| | | | |
|---|---|---|---|
| 4,671,851 | 6/1987 | Beyer et al. | 156/648 |
| 4,944,836 | 7/1990 | Beyer et al. | 156/656 |
| 5,045,899 | 9/1991 | Arimoto et al. | 357/23.6 |

FOREIGN PATENT DOCUMENTS

| | | | |
|---|---|---|---|
| 0286270 | 12/1987 | Japan | 357/23.6 |
| 0074752 | 3/1989 | Japan | 357/919 |
| 0094554 | 4/1990 | Japan | 437/52 |

OTHER PUBLICATIONS

"Stacked Capacitor DRAM Cell with Vertical Fins" IBM TDB, Jul. 1990, pp. 245-247.

"Crown-Shaped Stacked-Capacitor Cell for 1.5-V Operation 64-Mb Dram's" by T. Kaga et al., IEEE Transactions on Electron Devices, vol. 38, No. 2, Feb. 1991, pp. 255-261.

"A Stacked Capacitor Cell with Ring Structure" by N. Shinmura et al., pp. 833-836. (Extended abstracts of the 22rd International Conference on Solid State Devices, 1990).

*Primary Examiner*—Tom Thomas
*Attorney, Agent, or Firm*—David J. Paul

[57] ABSTRACT

An existing stacked capacitor fabrication process is modified to construct a three-dimensional stacked container capacitor. The present invention develops the container capacitor by etching an opening (or contact opening) into a low etch rate oxide. The contact opening is used as a form for deposited polysilicon that conforms to the sides of the opening walls. Within the thin poly lining of the oxide container a high etch-rate oxide, such as ozone TEOS, is deposited over the entire structure thereby bridging across the top of the oxide container. The high etch-rate oxide is planarized back to the thin poly and the resulting exposed poly is then removed to separate neighboring containers. The two oxides, having different etch rates, are then etched thereby leaving a free-standing poly container cell with 100% (or all) of the higher etch rate oxide removed and a pre-determined oxide surrounding the container still intact.

60 Claims, 4 Drawing Sheets

OPTIMIZED CONTAINER STACKED CAPACITOR DRAM CELL UTILIZING SACRIFICIAL OXIDE DEPOSITION AND CHEMICAL MECHANICAL POLISHING

CROSS-REFERENCE TO RELATED APPLICATION

This is a continuation to U.S. patent application Ser. No. 07/850,746, filed Mar. 13, 1992, now U.S. Pat. No. 5,162,248.

FIELD OF THE INVENTION

This invention relates to semiconductor circuit memory storage devices and more particularly to a process for fabricating three-dimensional stacked capacitor structures that may be used in such storage devices as high-density dynamic random access memories (DRAMs).

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

A paper submitted by N. Shinmura, et al., entitled "A Stacked Capacitor Cell with Ring Structure," Extended Abstracts of the 22nd International Conference on Solid State Devices and Materials, 1990, pp. 833-836, discusses a 3-dimensional stacked capacitor incorporating a ring structure around the main electrode to effectively double the capacitance of a conventional stacked capacitor.

The ring structure and its development is shown in FIGS. 1(c) through 1(g), pp. 834 of the article mentioned above. FIG. 1(a), on the same page shows a bird's eye-view of storage electrodes. The storage node is formed by two polysilicon layers that form a core electrode encircled by a ring structure. Capacitor dielectric film surrounds the whole surface of the storage node electrode and then is covered with a third polysilicon layer to form the top capacitor electrode and completes the storage cell. This design can be fabricated using current methods and increases storage capacitance by as much as 200%.

Also, in a paper submitted by T. Kaga, et al., entitled "Crown-Shaped Stacked-Capacitor Cell for 1.5-V Operation 64-Mb DRAM's," IEEE Transactions on Electron Devices. VOL. 38, NO. 2, February 1991, pp. 255-261, discusses a self-aligned stacked-capacitor cell for 64-Mb DRAM's, called a CROWN cell. The CROWN cell and its development are shown in FIGS. 7(d) through 7(f), pp. 258 of this article. The crown shaped storage electrode is formed over word and bit lines and separated by a oxide/nitride insulating layer with the top insulating layer being removed to form the crown shape. Capacitor dielectric film surrounds the whole surface of the storage node electrode and the top capacitor electrode is formed to complete the storage cell.

The present invention develops an existing stacked capacitor fabrication process to construct and optimize a three-dimensional container stacked capacitor cell. The capacitor's bottom plate (or storage node plate) is centered over a buried contact (or node contact) connected to an access transistor's diffusion area. The method presented herein provides fabrication uniformity and repeatability of the three-dimensional container cell.

SUMMARY OF THE INVENTION

The invention is directed to maximizing storage cell surface area in a high density/high volume DRAM (dynamic random access memory) fabrication process. An existing capacitor fabrication process is modified to construct a three-dimensional stacked container capacitor. The capacitor design of the present invention defines a stacked capacitor storage cell that is used in a DRAM process, however it will be evident to one skilled in the art to incorporate these steps into other processes requiring volatile memory cells, such as VRAMs or the like.

After a silicon wafer is prepared using conventional process steps, the present invention develops the container capacitor by etching a contact opening into a low etch rate oxide. The contact opening is used as a form for deposited polysilicon that conforms to the sides of the opening walls. Within the thin poly lining of the oxide container a high etch-rate oxide, such as ozone TEOS, is deposited over the entire structure thereby bridging across the top of the oxide container. The high etch-rate oxide is planarized back to the thin poly by using Chemical Mechanical Polishing (CMP). This CMP step is selective such that oxide is removed with sufficient overetch and stops on the thin poly. The resulting exposed poly is then removed to separate neighboring containers either through an isotropic wet poly etch or an additional CMP with the chemical aspect modified to now etch and selectively remove the poly and not the oxide. The two oxides, having different etch rates, are then etched by a single wet dilute BOE etch step, thereby leaving a free-standing poly container cell, with all the inside (high etch rate) oxide removed, that is equal in height to the depth of the original contact opening. In addition, a pre-determined amount of low etch rate oxide is removed thereby leaving oxide surrounding the ,container, poly for both structural support and process integration for further processing which requires oxide to be left above the word lines.

The present invention uses a higher etch-rate oxide inside the container to block the container poly etch. This high etch rate oxide is completely removed during oxide etch back. This protects the container during processing without adding photoresist and introducing extra processing steps or unwarranted contaminants. A standard CMP oxide etch is utilized that allows fabrication uniformity and repeatability across the wafer which cannot be achieved by resist filled container processes.

Another advantage of filling the container with high etch rate oxide is that the poly can be etched with a low cost, timed wet poly etch, while partially filled containers (as seen in FIG. 9), due to inherent recession of resist 92 height (to allow for sufficient process margin), will not allow a wet poly etch without loss in cell height 93, loss in uniformity and repeatability across the wafer's surface. Because this invention can be etched isotropically at poly etch, it avoids the recessing (overetch of the storage poly container 93 in FIG. 9) and splintering effects caused by a dry etch poly process.

As seen in FIG. 10, splintering effects 101 of storage node poly 93 result from a dry anisotropic etch (due to non-uniform etching of polycrystalline silicon 93) because the plasma etch reacts faster along heavily doped grain boundaries. Splinters 101 later tend to 'break off' in subsequent processing leading to contamination particulates. The trenching of the poly leads to the sidewalls of the poly container to be exposed, thus making it impossible to wet etch the oxide around the cell without translating the trenched poly horizontal portion of the etch into surrounding oxide 91 thereby leaving a ring of thin oxide around he container cell.

The present invention also protects the vertical sidewall of the oxide form by covering it with poly, thereby making a horizontal wet oxide etch back possible. In addition, all films which see etch processing, CMP or otherwise, are subsequently removed thereby acting as sacrificial films such that particles created during the CMP etch do not contaminate the inside of the poly container.

FIG. 1 shows a gray scale reproduction of a SEM photograph of an array of poly containers 12 which demonstrates the uniformity and repeatability of poly containers 12 across substrate that results from utilizing the process steps of the present invention discussed hereinafter.

DETAILED DESCRIPTION OF THE PREFERRED EMBODIMENT

The invention is directed to maximizing storage cell surface area, as well as providing uniform and repeatable, defect free, storage cell structures across a given substrate, in a high density/high volume DRAM fabrication process, in a sequence shown in FIGS. 2–7.

A silicon wafer is prepared using conventional process steps up to the point of processing an array of storage cell capacitors. Capacitor cell fabrication will now follow.

The storage capacitor of each memory cell will make contact directly to an underlying diffusion area. Each underlying diffusion area will have two storage node connections isolated from a single digit line contact by access transistors formed by poly word lines crossing the active area. Normally each diffusion area within the array is isolated from one another by a thick field oxide. The diffusion areas can be arranged in interdigitated columns and non-interdigitated rows or simply parallel and in line to one another in both the vertical and horizontal directions. As previously mentioned, the diffusion areas are used to form active MOS transistors (serving as access transistors to each individual capacitor) that can be doped as NMOS or PMOS type FETs depending on the desired use.

Figure 1:
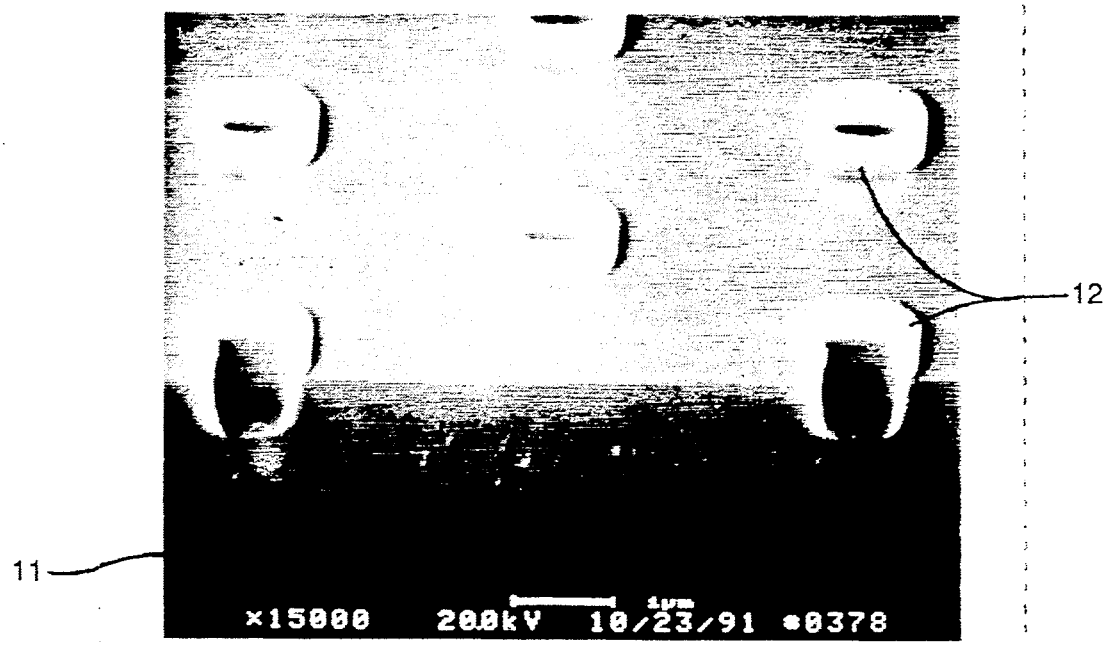
FIG. 1 is a gray-scale reproduction of a SEM (Scanning Electronic Microscope) photograph of a cross-sectional view of an array of container poly rings.
Figure 2:
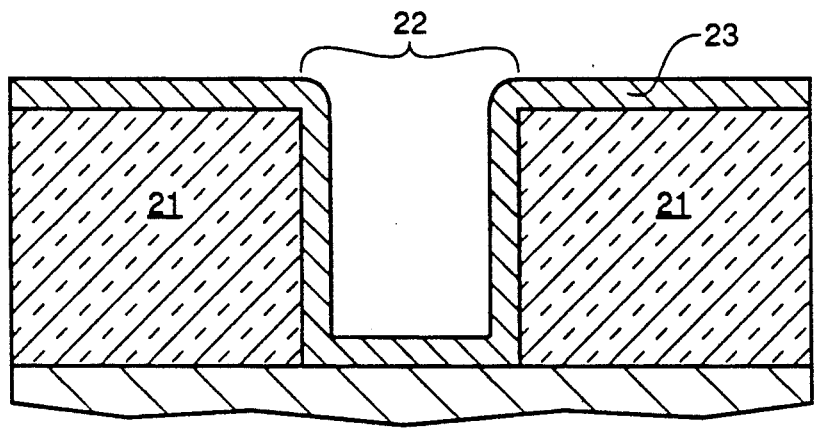
FIG. 2 is a composite cross-sectional view of an in-process wafer portion depicting the beginning steps of the present invention, said steps comprising forming a planarized layer of low etch rate oxide, etching a buried contact and placing a thin layer of conformal poly.

Referring now to FIG. 2, a thick layer of low etch rate oxide 21 is formed over an existing topography of a given substrate. Oxide 21 is then planarized, preferably by chemical-mechanical planarization (CMP) techniques down to a predetermined thickness. The thickness of planarized oxide 21 depends on the height that is desired for the poly container structure yet to be formed. The height of the resulting poly structure will determine the capacitor plate surface area that will be required to sufficiently hold a charge. It has been shown that a structure of approximately $1.0-1.5\mu$ is sufficient to construct a reliable 64M DRAM cell using optimized cell dielectric (Container height depends on such factors as container diameter, dielectric constant and thickness of oxides used which are brought to light in the continuing discussion.). A contact opening 22 is then etched into oxide 21 thereby allowing access to the underlying topography (for DRAM capacitor purposes this opening would normally expose a diffusion region conductively doped into a starting substrate). Contact opening 22 not only allows access to the underlying topography but also provides a form for a subsequent placed layer of thin poly. This thin poly is now formed, preferably by CVD, as a layer of conformal polysilicon 23 and is placed overlying planarized oxide 21, the patterned edges of oxide 21 and the exposed underlying topography. Poly 23 may either have been deposited insitu doped or deposited insitu doped and rugged HSG poly for added cell capacitance or it may be subsequently doped.

Figure 3:
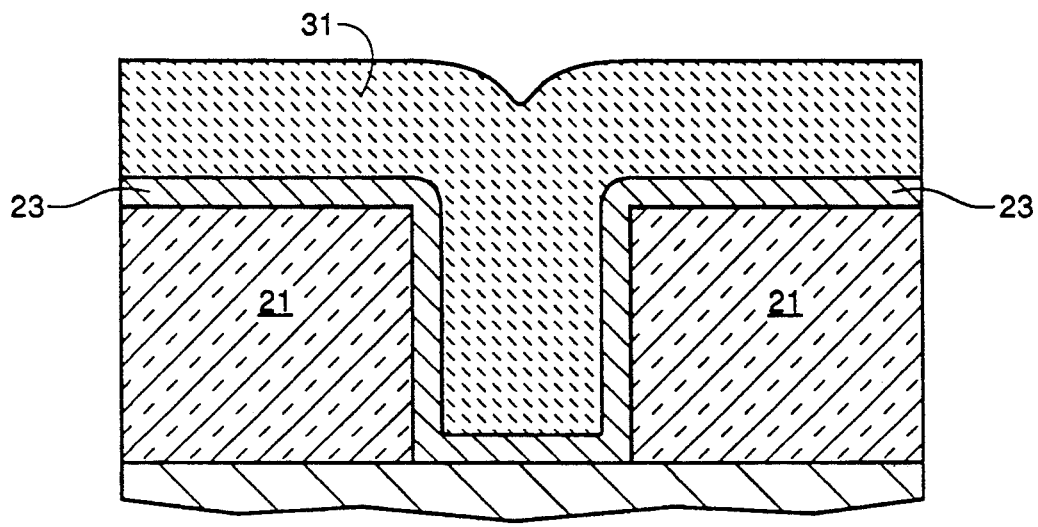
FIG. 3 is a cross-sectional view of the in-process wafer portion of FIG. 2 after formation of a layer of high etch rate oxide.

Referring now to FIG. 3, a thick layer of oxide 31 having a high etch rate is formed over poly 23. Oxide 31 is thick enough to completely fill the poly lined contact opening 22.

Figure 4:
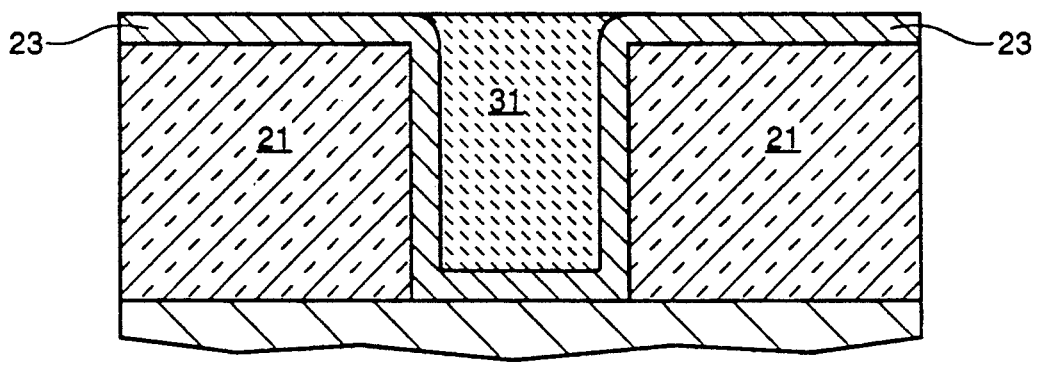
FIG. 4 is a cross-sectional view of the in-process wafer portion of FIG. 3 after planarization of the high etch rate oxide.

Referring now to FIG. 4, oxide layer 31 is removed down to poly 23, preferably by CMP which will selectively stop on the first exposed upper regions of poly 23.

Figure 5:
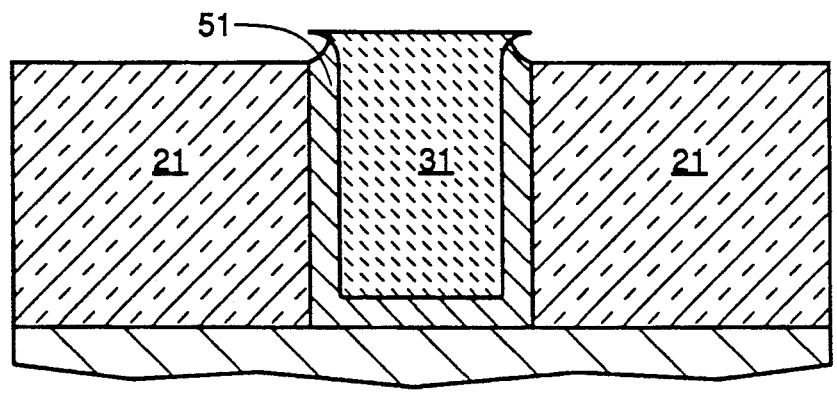
FIG. 5 is a cross-sectional view of the in-process wafer portion of FIG. 4 following a wet etch back of the exposed thin poly layer.

Referring now to FIG. 5, the exposed upper portions of poly 23 are removed to separate neighboring poly structures thereby forming individual containers 51 residing in contact openings 22 and exposing underlying oxide 21. The areas of poly 23 that are removed may be accomplished by performing a poly etch selective to oxide, which could be a timed wet etch or an optimized CMP poly etch. A very significant advantage of this process flow when a CMP etch step is utilized is that the inside of the future container 51 is protected from 'slurry' contamination that is inherent in the CMP step which proves difficult to remove in high aspect ratio storage containers (0.5μ inside diameter by 1.5μ high).

Figure 6:
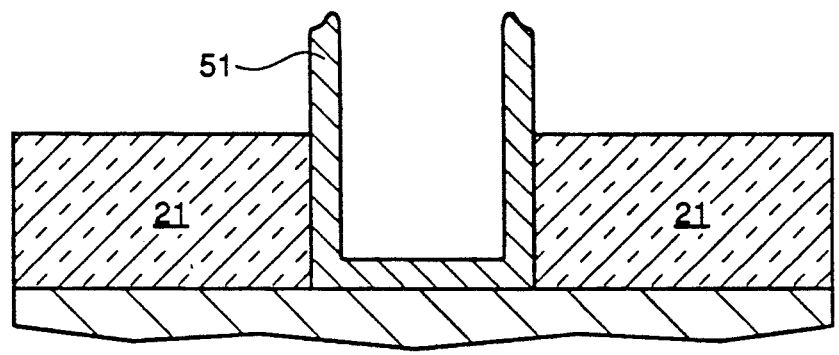
FIG. 6 is a cross-sectional view of the in-process wafer portion of FIG. 5 following an etch of both low etch rate and high etch rate oxides.

Referring now to FIG. 6, both oxides 21 and 31, which have different etch rates, are now exposed. At this point, an oxide etch is performed such that oxide 31 is completely removed from inside container 51 while a portion of oxide 21 remains at the base of container 51 and thereby providing an insulating layer between the underlying topography and subsequent layers. A etch rate ratio of 2:1 or greater between (a ratio of 4:1 is preferred) oxide 31 and oxide 22 provides sufficient process margin to ensure all of high etch rate oxide 31 inside container 51 is removed during the single etch step, while a portion of oxide 22 remains to provide adequate insulation from subsequently formed layers.

Figure 7:
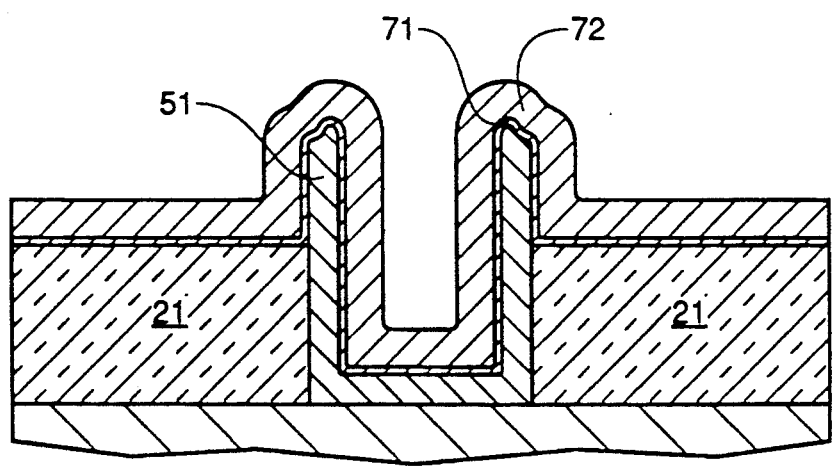
FIG. 7 is a cross-sectional view of the in-process wafer portion FIG. 6 following blanket formations of conformal cell dielectric and polysilicon, respectively.

Referring now to FIG. 7, when using this structure to form a capacitor storage node plate container 51 and the remaining portion of oxide 21 is coated with a capacitor cell dielectric 71. And, finally a second conformal poly layer 72 is placed to blanket cell dielectric 71 and serves as a common capacitor cell plate to the entire array of containers 51. From this point on the wafer is completed using conventional fabrication process steps.

Figure 8:
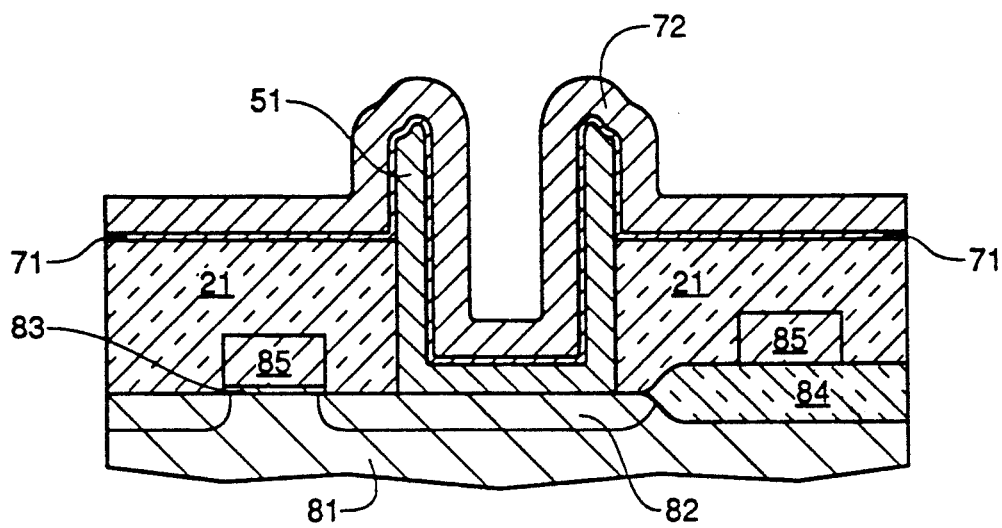
FIG. 8 is a cross-sectional view of a storage cell created by the present invention when integrated into a stacked capacitor fabrication process.
Figure 9:
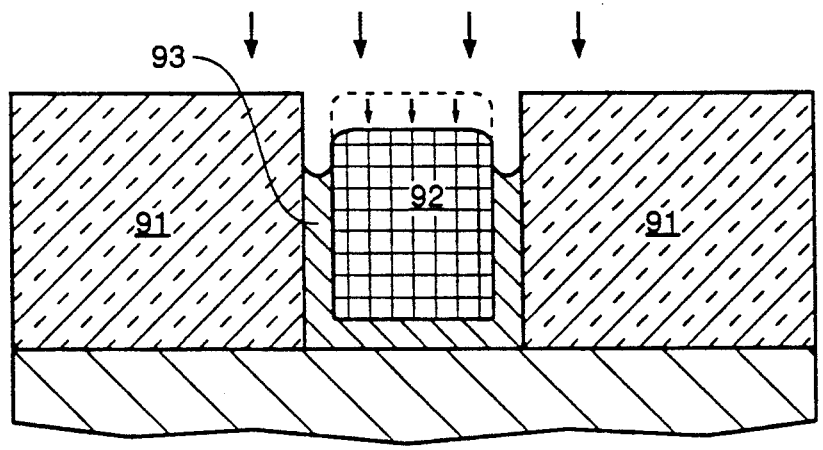
FIG. 9 is a composite cross-sectional view of an in-process wafer portion depicting a container cell filled with photoresist prior to patterning.
Figure 10:
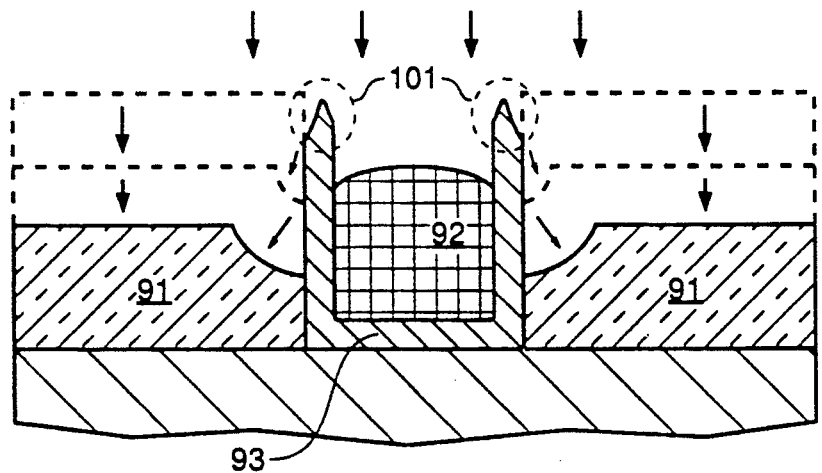
FIG. 10 is a composite cross-sectional view of the in-process wafer portion of FIG. 9 depicting splintering of storage node poly and formation of a thin ring of oxide surrounding the storage node poly following an anisotropic etching to pattern a container cell.

FIG. 8 depicts a cross-section of the present invention integrated into a stacked capacitor process on starting substrate 81. Container 51 connects to diffusion area 82 and thereby serves as a storage node container plate. Diffusion area 82 is accessed by word line 85 (separated by gate insulator 83) which in turn spans the channel's active area between diffusion areas 82. The poly of container 51 is doped to the same conductivity type as underlying diffusion region 82 to insure a good ohmic contact.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a uniform and repeatable conductive container structure on a starting substrate's existing topography, said process comprising the steps of:
   a) forming a blanketing first insulating layer, having a first etch rate, over said existing topography;
   b) patterning and etching an opening into said first insulating layer, said opening thereby forming a container form;
   c) forming a conformal first conductive layer superjacent said first insulating layer and said container form thereby lining said container form;
   d) forming a blanketing second insulating layer, having a second etch rate, superjacent said first conductive layer;
   e) removing said second insulating layer via chemical mechanical planarization until upper portion of said first conductive layer is exposed;
   f) removing said exposed first conductive upper layer until underlying said first insulating layer is exposed thereby separating said first conductive layer into individual said conductive containers having inner and outer walls;
   g) removing said first and said second insulating layers such that said second insulating layer is completely removed thereby exposing the entire inner walls of said conductive container and said first insulating layer is partially removed thereby exposing an upper portion of said outer walls of said conductive container, wherein the partially remaining first insulating layer provides insulation between said underlying substrate topography and subsequently formed layers;
   h) forming a third insulating layer superjacent and coextensive said exposed walls and inner bottom portion of said container and said partially remaining first insulating layer; and
   i) forming a second conductive layer superjacent and coextensive said third insulating layer.

2. A process as recited in claim 1, wherein said first insulating layer is planarized prior to said step of patterning and etching an opening into said first insulating layer.

3. A process as recited in claim 1, wherein said second insulating layer is a sacrificial layer conducive to said chemical mechanical planarization.

4. A process as recited in claim 1, wherein said first and said second insulating layers are oxides.

5. A process as recited in claim 1, wherein said first insulating layer etch rate is a lower etch rate than said second insulating layer etch rate.

6. A process as recited in claim 5, wherein the etch rate ratio between said second insulating layer etch rate and said first insulating layer etch rate is a ratio of 2:1 or greater.

7. A process as recited in claim 5, wherein the etch rate ratio between said second insulating layer etch rate and said first insulating layer etch rate is a ratio of 4:1.

8. A process as recited in claim 1, wherein said first and said second conductive layers are doped polysilicon.

9. A process as recited in claim 8, wherein said doped polysilicon is formed by insitu doped chemical vapor deposition.

10. A process as recited in claim 1, wherein said first, said second and said third insulating layers are formed by chemical vapor deposition.

11. A process for fabricating a uniform and repeatable conductive container structure on a starting substrate's existing topography, said process comprising the steps of:
   a) forming a blanketing first insulating layer, having a first etch rate, over said existing topography;
   b) patterning and etching an opening into said first insulating layer, said opening thereby forming a container form;
   c) forming a conformal first conductive layer superjacent said first insulating layer and said container form thereby lining said container form;
   d) forming a blanketing second insulating layer, having a second etch rate, superjacent said first conductive layer;
   e) removing said second insulating layer until upper portion of said first conductive layer is exposed;
   f) removing said exposed first conductive upper layer via chemical mechanical planarization until underlying said first insulating layer is exposed thereby separating said first conductive layer into individual said conductive containers having inner and outer walls;
   g) removing said first and said second insulating layers such that said second insulating layer is completely removed thereby exposing the entire inner walls of said conductive container and said first insulating layer is partially removed thereby exposing an upper portion of said outer walls of said conductive container, wherein the partially remaining first insulating layer provides insulation between said underlying substrate topography and subsequently formed layers;
   h) forming a third insulating layer superjacent and coextensive said exposed walls and inner bottom portion of said container and said partially remaining first insulating layer; and
   i) forming a second conductive layer superjacent and coextensive said third insulating layer.

12. A process as recited in claim 1, wherein said first insulating layer is planarized prior to said step of patterning and etching an opening into said first insulating layer.

13. A process as recited in claim 1, wherein said second insulating layer is a sacrificial layer that is planarized by chemical mechanical planarization.

14. A process as recited in claim 1, wherein said first and said second insulating layers are oxides.

15. A process as recited in claim 1, wherein said first insulating layer etch rate is a lower etch rate than said second insulating layer etch rate.

16. A process as recited in claim 15, wherein the etch rate ratio between said second insulating layer etch rate and said first insulating layer etch rate is a ratio of 2:1 or greater.

17. A process as recited in claim 15, wherein the etch rate ratio between said second insulating layer etch rate and said first insulating layer etch rate is a ratio of 4:1.

18. A process as recited in claim 1, wherein said first and said second conductive layers are doped polysilicon.

19. A process as recited in claim 18, wherein said doped polysilicon is formed by insitu doped chemical vapor deposition.

20. A process as recited in claim 1, wherein said first, said second and said third insulating layers are formed by chemical vapor deposition.

21. A process for fabricating a uniform and repeatable conductive container structure on a starting substrate's existing topography, said process comprising the steps of:
   a) forming a blanketing first insulating layer, having a first etch rate, over said existing topography;
   b) patterning and etching an opening into said first insulating layer, said opening thereby forming a container form;
   c) forming a conformal first conductive layer superjacent said first insulating layer and said container form thereby lining said container form;
   d) forming a blanketing second insulating layer, having a second etch rate, superjacent said first conductive layer;
   e) removing said second insulating layer via chemical mechanical planarization until upper portion of said first conductive layer is exposed;
   f) removing said exposed first conductive upper layer via chemical mechanical planarization until underlying said first insulating layer is exposed thereby separating said first conductive layer into individual said conductive containers having inner and outer walls;
   g) removing said first and said second insulating layers such that said second insulating layer is completely removed thereby exposing the entire inner walls of said conductive container and said first insulating layer is partially removed thereby exposing an upper portion of said outer walls of said conductive container, wherein the partially remaining first insulating layer provides insulation between said underlying substrate topography and subsequently formed layers;
   h) forming a third insulating layer superjacent and coextensive said exposed walls and inner bottom portion of said container and said partially remaining first insulating layer; and
   i) forming a second conductive layer superjacent and coextensive said third insulating layer.

22. A process as recited in claim 21, wherein said first insulating layer is planarized prior to said step of patterning and etching an opening into said first insulating layer.

23. A process as recited in claim 21, wherein said second insulating layer is a sacrificial layer conducive to said chemical mechanical planarization.

24. A process as recited in claim 21, wherein said first and said second insulating layers are oxides.

25. A process as recited in claim 21, wherein said first insulating layer etch rate is a lower etch rate than said second insulating layer etch rate.

26. A process as recited in claim 25, wherein the etch rate ratio between said second insulating layer etch rate and said first insulating layer etch rate is a ratio of 2:1 or greater.

27. A process as recited in claim 25, wherein the etch rate ratio between said second insulating layer etch rate and said first insulating layer etch rate is a ratio ob 4:1.

28. A process as recited in claim 21, wherein said first and said second conductive layers are doped polysilicon.

29. A process as recited in claim 28, wherein said doped polysilicon is formed by insitu doped chemical vapor deposition.

30. A process as recited in claim 21, wherein said first, said second and said third insulating layers are formed by chemical vapor deposition.

31. A process for fabricating a DRAM container storage capacitor on a silicon substrate having active areas, word lines and digit lines, said process comprising the following sequence of steps:
- a) forming a blanketing first insulating layer, having a first etch rate, over said existing topography;
- b) patterning and etching an opening into said first insulating layer, said opening thereby forming a container form;
- c) forming a conformal first conductive layer superjacent said first insulating layer and said container form thereby lining said container form;
- d) forming a blanketing second insulating layer, having a second etch rate, superjacent said first conductive layer;
- e) removing said second insulating layer via chemical mechanical planarization until upper portion of said first conductive layer is exposed;
- f) removing said exposed first conductive upper layer until underlying said first insulating layer is exposed thereby separating said first conductive layer into individual said container storage capacitors having inner and outer walls;
- g) removing said first and said second insulating layers such that said second insulating layer is completely removed thereby exposing the entire inner walls of said container storage capacitor and said first insulating layer is partially removed thereby exposing an upper portion of said outer walls of said container storage capacitor, wherein the partially remaining first insulating layer provides insulation between said underlying substrate topography and subsequently formed layers;
- h) forming a third insulating layer superjacent and coextensive said exposed walls and inner bottom portion of said capacitor and said partially remaining first insulating layer; and
- i) forming a second conductive layer superjacent and coextensive said third insulating layer.

32. A process as recited in claim 31, wherein said first insulating layer is planarized prior to said step of patterning and etching an opening into said first insulating layer.

33. A process as recited in claim 31, wherein said second insulating layer is a sacrificial layer conductive to said chemical mechanical planarization.

34. A process as recited in claim 31, wherein said first and said second insulating layers are oxides.

35. A process as recited in claim 31, wherein said first insulating layer etch rate is a lower etch rate than said second insulating layer etch rate.

36. A process as recited in claim 35, wherein the etch rate ratio between said second insulating layer etch rate and said first insulating layer etch rate is a ratio of 2:1 or greater.

37. A process as recited in claim 35, wherein the etch rate ratio between said second insulating layer etch rate and said first insulating layer etch rate is a ratio of 4:1.

38. A process as recited in claim 31, wherein said first and said second conductive layers are doped polysilicon.

39. A process as recited in claim 38, wherein said doped polysilicon is formed by insitu doped chemical vapor deposition.

40. A process as recited in claim 31, wherein said first, said second and said third insulating layers are formed by chemical vapor deposition.

41. A process for fabricating a DRAM container storage capacitor on a silicon substrate having active areas, word lines and digit lines, said process comprising the following sequence of steps:
- a) forming a blanketing first insulating layer, having a first etch rate, over said existing topography;
- b) patterning and etching an opening into said first insulating layer, said opening thereby forming a container form;
- c) forming a conformal first conductive layer superjacent said first insulating layer and said container form thereby lining said container form.
- d) forming a blanketing second insulating layer, having a second etch rate, superjacent said first conductive layer;
- e) removing said second insulating layer until upper portion of said first conductive layer is exposed;
- f) removing said exposed first conductive upper layer via chemical mechanical planarization until underlying said first insulating layer is exposed thereby separating said first conductive layer into individual said container storage capacitors having inner and outer walls;
- g) removing said first and said second insulating layers such that said second insulating layer is completely removed thereby exposing the entire inner walls of said container storage capacitor and said first insulating layer is partially removed thereby exposing an upper portion of said outer walls of said container storage capacitor, wherein the partially remaining first insulating layer provides insulation between said underlying substrate topography and subsequently formed layers;
- h) forming a third insulating layer superjacent and coextensive said exposed walls and inner bottom portion of said capacitor and said partially remaining first insulating layer; and
- i) forming a second conductive layer superjacent and coextensive said third insulating layer.

42. A process as recited in claim 41, wherein said first insulating layer is planarized prior to said step of patterning and etching an opening into said first insulating layer.

43. A process as recited in claim 41, wherein said second insulating layer is a sacrificial layer that is planarized by chemical mechanical planarization.

44. A process as recited in claim 41, wherein said first and said second insulating layers are oxides.

45. A process as recited in claim 41, wherein said first insulating layer etch rate is a lower etch rate than said second insulating layer etch rate.

46. A process as recited in claim 45, wherein the etch rate ratio between said second insulating layer etch rate and said first insulating layer etch rate is a ratio of 2:1 or greater.

47. A process as recited in claim 45, wherein the etch rate ratio between said second insulating layer etch rate and said first insulating layer etch rate is a ratio of 4:1.

48. A process as recited in claim 41, wherein said first and said second conductive layers are doped polysilicon.

49. A process as recited in claim 48, wherein said doped polysilicon is formed by insitu doped chemical vapor deposition.

50. A process as recited in claim 41, wherein said first, said second and said third insulating layers are formed by chemical vapor deposition.

51. A process for fabricating a DRAM container storage capacitor on a silicon substrate having active areas, word lines and digit lines, said process comprising the following sequence of steps:
 a) forming a blanketing first insulating layer, having a first etch rate, over said existing topography;
 b) patterning and etching an opening into said first insulating layer, said opening thereby forming a container form;
 c) forming a conformal first conductive layer superjacent said first insulating layer and said container form thereby lining said container form;
 d) forming a blanketing second insulating layer, having a second etch rate, superjacent said first conductive layer;
 e) removing said second insulating layer via chemical mechanical planarization until upper portion of said first conductive layer is exposed;
 f) removing said exposed first conductive upper layer via chemical mechanical planarization until underlying said first insulating layer is exposed thereby separating said first conductive layer into individual said container storage capacitors having inner and outer walls;
 g) removing said first and said second insulating layers such that said second insulating layer is completely removed thereby exposing the entire inner walls of said container storage capacitor and said first insulating layer is partially removed thereby exposing an upper portion of said outer walls of said container storage capacitor, wherein the partially remaining first insulating layer provides insulation between said underlying substrate topography and subsequently formed layers;
 h) forming a third insulating layer superjacent and coextensive said exposed walls and inner bottom portion of said capacitor and said partially remaining first insulating layer; and
 i) forming a second conductive layer superjacent and coextensive said third insulating layer.

52. A process as recited in claim 51, wherein said first insulating layer is planarized prior to said step of patterning and etching an opening into said first insulating layer.

53. A process as recited in claim 51, wherein said second insulating layer is a sacrificial layer conducive to said chemical mechanical planarization.

54. A process as recited in claim 51, wherein said first and said second insulating layers are oxides.

55. A process as recited in claim 51, wherein said first insulating layer etch rate is a lower etch rate than said second insulating layer etch rate.

56. A process as recited in claim 55, wherein the etch rate ratio between said second insulating layer etch rate and said first insulating layer etch rate is a ratio of 2:1 or greater.

57. A process as recited in claim 55, wherein the etch rate ratio between said second insulating layer etch rate and said first insulating layer etch rate is a ratio of 4:1.

58. A process as recited in claim 51, wherein said first and said second conductive layers are doped polysilicon.

59. A process as recited in claim 58, wherein said doped polysilicon is formed by insitu doped chemical vapor deposition.

60. A process as recited in claim 51, wherein said first, said second and said third insulating layers are formed by chemical vapor deposition.

* * * * *